United States Patent [19]

Kaufman

[11] 4,156,148

[45] May 22, 1979

[54] PHOTOCOUPLING STRUCTURE FOR A SOLID STATE POWER CONTROL DEVICE

[75] Inventor: Lance R. Kaufman, Milwaukee, Wis.

[73] Assignee: Gentron Corporation, Milwaukee, Wis.

[21] Appl. No.: 825,619

[22] Filed: Aug. 18, 1977

[51] Int. Cl.² .............................................. G02B 27/00
[52] U.S. Cl. ...................................... 250/551; 357/19
[58] Field of Search ............... 250/551, 239, 227, 209; 357/19

[56] References Cited

U.S. PATENT DOCUMENTS

| 3,660,669 | 5/1972 | Grenon | 357/19 |
| 3,822,384 | 7/1974 | Chapron et al. | 250/551 |
| 3,906,240 | 9/1975 | Jeffree | 250/239 |

*Primary Examiner*—David C. Nelms
*Attorney, Agent, or Firm*—Ralph G. Hohenfeldt

[57] ABSTRACT

An electric control device having a high power thick film controlled circuit including a photon activated switch all on an insulating substrate. A photon emitting control element in a low power control circuit is supported from strips extending from the lead frame of the device. The strips are bendable, allowing the emitting element to be folded over the photon activated switch to thereby establish optical coupling and electrical isolation between the control and the controlled circuits.

9 Claims, 5 Drawing Figures

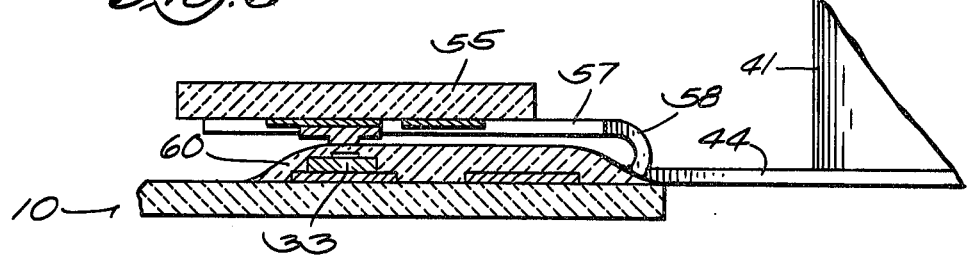
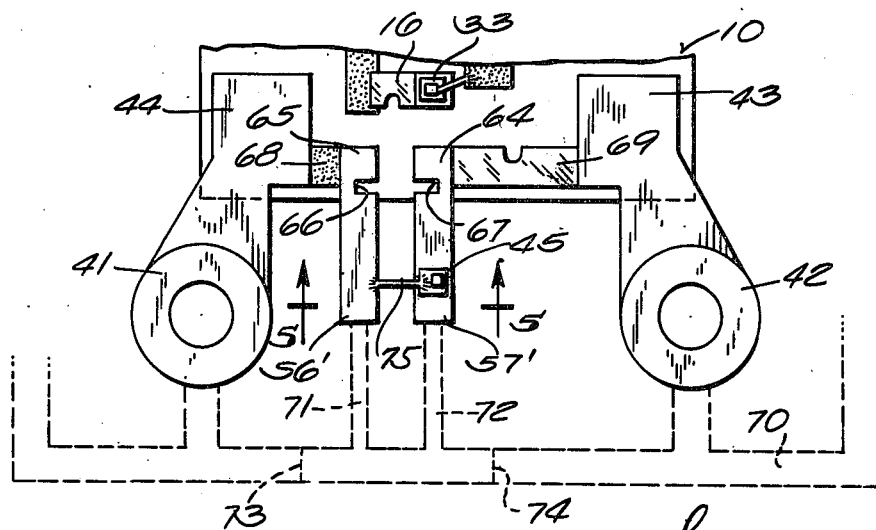
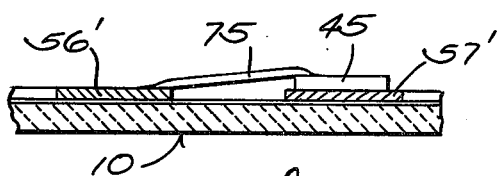

PHOTOCOUPLING STRUCTURE FOR A SOLID STATE POWER CONTROL DEVICE

BACKGROUND OF THE INVENTION

This invention relates to solid state power control devices such as solid state electric relays wherein it is desired to obtain electric isolation and optical coupling between a high power controlled circuit and a low power control circuit. Typically, the invention is applicable to thick film hybrid devices comprising a ceramic substrate with a thick film controlled circuit adhered to it and with at least one light activated switch in the circuit which is to be activated by a light emitting element such as a light emitting diode (LED) that is to be electrically isolated but optically coupled with the switch element. The term "light" is used herein in a broad sense and is intended to encompass radiation within the visible wavelength band as well as outside of this band such as in the ultraviolet and infrared bands.

As is well known, solid state control devices such as relays comprise thick film conductors adhered to a surface of a ceramic substrate with passive and active circuit elements connected between the conductors. Typically, such devices are fabricated by printing thick film conductive bands on a selectively metallized substrate using a slurry of conductive particles which is then dried. Passive elements such as resistors are then formed by printing with a slurry of more resistive particles then fired at a temperature of 850° C. to 1100° C. A lead frame comprised of joined thin metal strips is then deposited on certain of the conductive bands. Prefabricated capacitors and active elements such as transistors, silicon controlled rectifiers, diodes and triacs on which solder or other fusible material has been previously applied are deposited at appropriate places relative to the printed circuits and lead frame. The interfaces of the components are metallized such as with solder. The whole assembly is then heated, usually to a maximum of 350° C., to cause the fusible metallizing material to reflow and effect a bond between the parts which becomes rigid after the device is cooled. An illustrative thick flim device may be seen in U.S. Pat. No. 3,958,075 which is assigned to the assignee of this application.

Solid state relays often have at least one light receiver such as a light activated switch operating in a comparatively high voltage and high current load circuit. High power load or controlled circuits of this type are often activated with a light emitting device such as a light emitting diode (LED) which is in a low voltage control circuit and which must be electrically isolated from, but optically coupled with, the light activated element. The low voltage control circuit usually has other elements such as diodes and resistors in series with the LED. Prior practice has been to deposit the elements of the control circuit on the substrate such that the LED was positioned where it would be optically coupled with the light activated element in the load circuit. This method of construction required several of the reflowing or fusing operations which were mentioned above. When using this method, it is difficult to get the light emitting and light receiving circuit elements accurately aligned for obtaining optimum coupling and, hence, sensitivity.

Heretofore, in order to achieve optical coupling and electric isolation in a hybrid circuit, three choices were available. One was to use a discrete photon or light coupled pair package and to mount this package in whatever space was available on the substrate. Another choice was to use two independent substrates using planar coupling with a reflective dome. Another choice was to use an LED combination on a perpendicular structure with a glass type interface isolation wherein the elements were mounted in a single plane. All of these choices had the disadvantages of either requiring multiple reflow operations or requiring a substantial amount of space.

SUMMARY OF THE INVENTION

An object of the present invention is to provide a structure for obtaining optical coupling between the light receiving element in a controlled or output circuit and a light emitting element in a controlling or input circuit in a thick film device.

A further object is to provide for mounting the light emitting element separately from the main substrate on which the output circuit is adhered so that various input circuits associated with the light emitting element can be selected while the output circuit remains constant.

A further object is to provide for using a photon coupled pair in a thick film or hybrid circuit in such manner that the number of reflow operations is minimized.

Another object is to provide a structure which facilitates obtaining close and accurate coupling between a light emitting element and a light receiving element.

Generally, in accordance with the invention, the controlled or output circuit of a thick film device such as a solid state relay is formed in the usual way on a substrate. The controlling circuit, however, or at least the light emitting element is mounted to bendable strips which may be extensions of the lead frame. The strips are nominally unbent during preliminary fabrication and they are subsequently bent or folded over to place the photon emitting element over the photon receiving element.

How the foregoing and other more specific objects of the invention are achieved will appear in the more detailed description of illustrative embodiments of the invention which will now be set forth in reference to the drawings.

DESCRIPTION OF THE DRAWINGS

FIG. 3 is a vertical section taken on a line corresponding with 3—3 in FIG. 2;

FIG. 4 is a plan view of a fragment of an alternative embodiment of the invention; and FIG. 5 is a vertical section taken on a line corresponding with 5—5 in FIG. 4.

DESCRIPTION OF A PREFERRED EMBODIMENT

Figure 1:
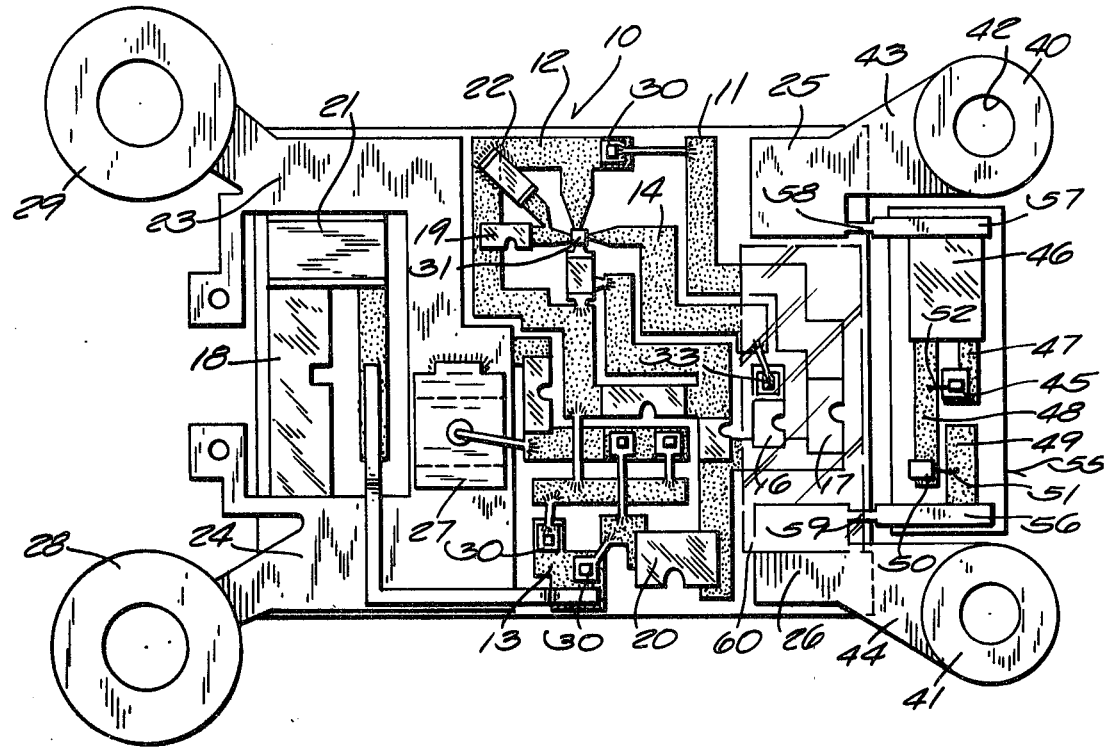
FIG. 1 is a plan view of a solid state relay, before encapsulation, which is typical of devices in which the new photon coupling arrangement may be used.

The solid state relay which is used to illustrate an application of the new photon coupling arrangement is shown in FIG. 1. It comprises a thin ceramic plate, herein called a substrate 10, with a thick film circuit including circuit elements adhered to its top surface. By way of example, highly conductive bands such as those which are stippled and marked 11-14 are printed and fused on the top surface of substrate 10. Resistors which are shaded and typified by those marked 16-20 are also printed and fused at appropriate places in gaps defined by circuit elements and conductive bands. Typical capacitors 21 and 22 are distinguished with cross hatching. Typical planar portions of the lead frame are marked 23, 24, 25 and 26. These lead frame portions are metal foils which are superimposed and bonded or reflowed on underlying corresponding highly conductive bands. In this circuit, a triac 27 is the main switch used for completing a circuit between output terminals 28 and 29 which are in the load circuit, not shown.

The device also includes circuit elements such as diodes 30 and transistors 31. The light or photon activated element or receiver is marked 33. In this example, element 33 is a light activated silicon controlled rectifier (LASCR) which turns on in response to receiving light such that, through intermediate driving circuitry, triac switch 27 will turn on at the same time to complete the circuit between output terminals 28 and 29. Typically, the output circuit just described, that is, the circuit containing triac 27 will be a 120 volt or 240 volt circuit having a substantial current rating.

The low voltage control circuit will now be described. It is in electrical continuity between low voltage control signal input terminals 40 and 41. Terminal 40, like the others, is a metal cylinder which has a threaded central hole 42. This cylinder is bonded by reflowing to an extension 43 of the lead frame foil which is continuous with portion 25 of the lead frame. Similarly, input terminal 41 is bonded to a lead frame extension 44 which is continuous with portion 26. An electric circuit, including a photon or light emitting diode 45, is connected between lead frame portions 25 and 26. The circuit includes a thick film resistor 46 and highly conductive bands 47, 48 and 49. A diode body 50 is bonded to conductive band 48 and its lead 51 is connected to band 49. The body of LED 45 is electrically bonded to conductive band 47 and has its lead 52 connected to band 48. These circuit elements are adhered to a ceramic substrate 55.

The substrate 55 is supported on a pair of lead frame extensions 56 and 57. These strips are notched to create narrow webs 58 and 59 which control the point or line on which strips 56 and 57 will bend when substrate 55 is turned or folded like the page of a book over the main substrate 10. In FIG. 1, strips 56 and 57 are nominally unbent, that is, they and the substrate 55 which they support are essentially coplanar with substrate 10.

Figure 2:
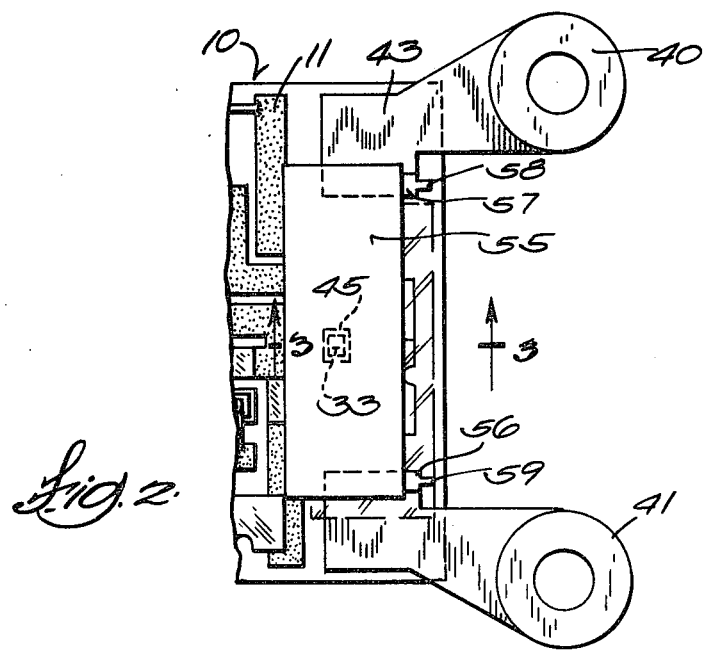
FIG. 2 is a fragment of the right end of the device in FIG. 1 illustrating the arrangement of the parts after the photon emitting element is folded over the photon receiving element.

FIGS. 2 and 3 show substrate 55 folded over substrate 10. This results in LED 45 being superimposed on and in proximity with LASCR 33 to establish the desired light or photon coupling. After substrate 55 is folded over from its FIG. 1 to its FIG. 2 position, a light transmissive insulating layer is disposed between the two substrates. This layer is shown as a dashed line rectangle in FIG. 3 and is marked 60. In a commercial device, a clear silicone material is used for layer 60. It has high dielectric strength and assures that none of the elements in the low voltage control circuit on substrate 55 will become electrically unisolated from the higher voltage circuits on the main substrate 10.

Two of the advantages which were mentioned earlier as consequences of making the device as just described should now be apparent. First, it should be noted that the thick film circuit on the main substrate 10 and the circuit on the other small substrate 55 are reflowed simultaneously rather than in sequence. For this operation, of course, substrates 55 and 10 are supported in a coplanar fashion on a platform so none of the elements will change position during reflow. Secondly, it should be noted that the relay may be easily adapted for various control circuits. For instance, the controlled or power circuit on the main substrate 10 may be used in conjunction with a variety of control circuits on substrate 55. Various control circuits can be built on substrate 55 prior to the single reflow operation. For instance, as control circuit voltages differ, it may be desirable to insert higher or lower value resistors such as 46 in series with the photon emitting element 45 or other circuit configurations might be developed. This allows substantial design flexibility as compared with the prior art practice of mounting the photon emitting element directly on the main substrate by one of the three prior methods mentioned earlier.

FIG. 3 further shows how transparent insulating layer 60 assures that light emitting and receiving elements 45 and 33, respectively, are maintained in positive spaced relationship by insulating layer 60. Moreover, the thinned down section such as 58 assures that a strip such as 57 will always bend at a predictable place so elements 33 and 45 will always be properly aligned to obtain the most effective light coupling between the elements.

An alternative embodiment of the invention is depicted in FIG. 4. In this embodiment, like parts are given the same reference numerals as corresponding parts in the FIGS. 1-3 embodiment. In this case, a photon emitting device 45 is bonded to a bendable strip 57' in alignment with light receiver element 33 on substrate 10. The end portion 64 of strip 57' is bonded directly to substrate 10. Another bendable strip 56' has its end portion 65 bonded to substrate 10. Bendable strips 56' and 57' are notched as at 66 and 67 to establish the line on which the strips will bend. Strip 56' is connected to lead frame portion 44 with a highly conductive band 68 that is adhered to substrate 10. Thick film resistor 69 is adhered to substrate 10 and connects the strip 57' to lead frame portion 43. Thus, a series electric circuit is established between terminals 40 and 41. A portion of the lead frame 70, which is ordinarily clipped off after the device is reflowed, is shown in dashed lines in FIG. 4. Extensions 71 and 72 of the lead frame are initially integral with strips 56' and 57', respectively. As a preliminary to the process of bending or folding strips 56' and 57' over to dispose light emitting element 45 near photon receiving element 33, the lead frame is cut at lines 73 and 74, thus leaving the strips 56' and 57' tied together. They are then bent over as a unit and the fact that they are tied together assures that both strips will bend through the same angle and in one operation. The extensions 71 and 72 are ten severed from the strips. In this embodiment, the photon emitting element 45 has one of its leads 75 spanning from strip 57' to 56' to which it is bonded, soldered or reflowed. An elevation view of the elements before the strips are bent is shown in FIG. 5. Although the light transparent insulating layer corresponding with layer 60 is not shown in the FIG. 4 embodiment, it will be understood to be present.

The FIG. 4 embodiment offers essentially the same design flexibility as the previously discussed embodiment. A variety of control circuits can be developed for being interposed between lead frame portions 43 and 44 for use with a standardized controlled circuit on substrate 10. Accurate placement of element 45 over element 33 is obtainable by virtue of strip portions 56' and 57' bending at a predictable place such as in the notched regions 66 and 67. Again, all of the elements in the control circuit such as conductive band 68, strips 56' and 57', emitter 45 and resistor 69 may be reflowed concurrently with reflowing the elements on substrate 10.

The bendable strips such as 56 and 57 may be arranged in other configurations, not shown. For instance, their ends such as 64 and 65 which are fastened directly to substrate 10 in the FIG. 4 embodiment can be recessed in the ceramic or be made integral with or recessed in lead frame portions 43 and 44 to produce a larger span between them. Other circuit elements may then be variously mounted on them.

When the devices are assembled as described above, they are finally encapsulated in a solid resin or inserted into a premolded housing, not shown, with only terminals 28, 29 and 41, 42 protruding to enable making electrical connections to the output and input circuits.

The devices which have been described in detail heretofore, by way of example, have the photon receiver, such as LASCR 33, mounted to main substrate 10 and the photon emitter, such as LED 45, mounted to a bendable element to enable folding the emitter over the stationary receiver. In some devices, the converse of this construction may be desirable; that is, the emitter may be mounted to the main stationary substrate and the receiver may be mounted to a bendable element to enable folding the receiver over the emitter. Thus, the invention contemplates any construction wherein one of the receiver or emitter elements is mounted to a bendable element to enable relative movement between them.

Although the concept of mounting circuit elements for independent input and output circuits has been described in considerable detail in conjunction with a solid state relay, it should be understood that such description is intended to be illustrative rather than limiting, for the invention may be variously embodied and is to be limited only by construing the claims which follow.

I claim:

1. A solid state power control device wherein it is desired to establish optical coupling between a light receiver circuit element and a light emitter circuit element, comprising:
   an insulating member,
   a bendable metal member mounted to said insulating member,
   a light emitter circuit element mounted to one of said insulating member and said bendable metal member and a light receiver circuit element mounted to the other of said members,
   said element which is mounted to said bendable member being disposed remotely from the other element when said bendable member is in nominally unbent condition and being disposed in sufficient proximity with said other element as a result of said bendable member being bent to establish an optical coupling between said elements.

2. A device wherein it is desired to establish optical coupling between a light receiving circuit element and a light emitting circuit element, comprising:
   an insulating member having a first electric circuit affixed thereto,
   a light receiving circuit element connected in said first circuit,
   a bendable metal strip having a first portion mounted to said member and a second portion extending away from said first portion,
   a light emitting circuit element supported from the second portion of said metal strip to dispose said element remotely from said light receiving element when said strip is in a nominally unbent condition and to dispose said light emitting element in sufficient proximity with said light receiving element to establish an optical coupling when said strip is in bent condition.

3. In an electric control device including an insulating plate, first electric circuit means supported from said plate, and a second circuit means electrically isolated from said first circuit means, the improvement comprising:
   a light controlled circuit element as one of the elements operative in one of said circuit means,
   a light emitting circuit element as one of the elements operative in the other circuit means for controlling said light controlled element,
   bendable conductive metal strip means having a first portion mounted to said insulating plate and a second portion remote from said first portion, and
   means for mounting one of said light emitting elements and said light receiving elements to said bendable metal strip means and the other of said elements to said plate such that when said strip means are in nominally unbent condition said elements are remote from each other and when said strip means are in bent condition said elements are disposed in sufficient proximity to establish otpical coupling between them.

4. The device as in claim 3 including a layer of light transmissive insulating material interposed between said light controlled element and said light emitting element.

5. The device as in claim 3 wherein there are:
   first and second terminals constituting part of said second circuit means and mounted on said insulating plate in spaced apart relation and in conductive relation with said strip means, respectively,
   said means for mounting said one element to said bendable metal strip means comprising another insulating plate having a surface bonded to said strip means, said one element being bonded to said other plate and being in said second electric circuit.

6. The device as in claim 5 including:
   thick film conductors adhering to said other insulating plate to form a part of said second electric circuit, said light emitting element being connected between said conductors and said conductors being in electrical continuity with said strip means.

7. The device as in claim 6 wherein said strip means comprises a pair of strips and including:
   at least one thick film resistor adhered to said other insulating plate and interposed in a portion of said second circuit between said strips.

8. The device as in claim 5 including:
   first and second terminals constituting part of said second circuit means and mounted to said other insulating plate in spaced apart relation,
   at least one thick film resistor adhered to said other plate adjacent at least one of said terminals for providing electrical continuity between the first of said terminals and one of said strip means,
   means for providing electrical continuity between the second of said terminals and the other of said strip means,
   said means for mounting said one element comprising means for bonding said element to one of said strip means, and a conductor for electrically connecting said emitting element to the other of said strip means.

9. The device as in claim 3 including:

first and second terminals constituting part of said second circuit means and mounted on said insulating plate in spaced apart relation, at least one thick film resistor adhered to said plate adjacent at least one of said terminals for providing electrical continuity between the first and said terminals and one of the strips comprising said strip means, means for providing electrical continuity between the second of said terminals and the other of the strips comprising said strip means, said one element being said light emitting element and said means for mounting said light emitting element to said bendable metal strip means comprising conductors extending from said light emitting means, said conductors being bonded to said respective strips.

* * * * *